(12) United States Patent
Dusad et al.

(10) Patent No.: US 10,673,456 B1
(45) Date of Patent: Jun. 2, 2020

(54) CONVERSION AND FOLDING CIRCUIT FOR DELAY-BASED ANALOG-TO-DIGITAL CONVERTER SYSTEM

(71) Applicant: TEXAS INSTRUMENTS INCORPORATED, Dallas, TX (US)

(72) Inventors: Shagun Dusad, Bengaluru (IN); Chirag Chandrahas Shetty, Thane (IN); Visvesvaraya Appala Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/410,698

(22) Filed: May 13, 2019

Related U.S. Application Data

(60) Provisional application No. 62/786,582, filed on Dec. 31, 2018.

(51) Int. Cl.
   *H03M 1/50* (2006.01)
   *H03M 1/14* (2006.01)
   *H03M 1/20* (2006.01)
   *H03M 1/44* (2006.01)

(52) U.S. Cl.
   CPC .......... *H03M 1/502* (2013.01); *H03M 1/141* (2013.01); *H03M 1/204* (2013.01); *H03M 1/206* (2013.01); *H03M 1/445* (2013.01)

(58) Field of Classification Search
   CPC ...... H03M 1/502; H03M 1/445; H03M 1/141; H03M 1/206; H03M 1/204
   USPC ......................................... 341/155, 158–159
   See application file for complete search history.

(56) References Cited

U.S. PATENT DOCUMENTS

| | | | |
|---|---|---|---|
| 5,495,247 A | 2/1996 | Yamamoto et al. | |
| 7,557,746 B1 | 7/2009 | Waltari | |
| 7,737,875 B2 | 6/2010 | Waltari et al. | |
| 8,089,388 B2 * | 1/2012 | Cui .................. | H03M 1/002 341/155 |
| 8,183,903 B2 * | 5/2012 | Glass ................. | H03M 1/204 327/231 |

* cited by examiner

*Primary Examiner* — Khai M Nguyen
(74) *Attorney, Agent, or Firm* — Mark Allen Valetti; Charles A. Brill; Frank D. Cimino

(57) ABSTRACT

A conversion and folding circuit includes a voltage-to-delay converter block, including preamplifiers, for converting a voltage signal into delay signals, and a folding block, including logic gates coupled to the preamplifiers, for selecting earlier-arriving and later-arriving ones of the delay signals. If desired, the logic gates may include odd and even chains for outputting delay signals to first and second analog-to-digital converters. If desired, the conversion and folding circuit may include first and second chains, and a chain selection circuit for selectively outputting a delay signal from a desired one of the first and second chains.

19 Claims, 7 Drawing Sheets

US 10,673,456 B1

CONVERSION AND FOLDING CIRCUIT FOR DELAY-BASED ANALOG-TO-DIGITAL CONVERTER SYSTEM

This application claims priority to U.S. Provisional Patent Application No. 62/786,582, filed Dec. 31, 2018. The entire disclosure of U.S. Provisional Patent Application No. 62/786,582 is hereby fully incorporated herein by reference.

BACKGROUND

An analog-to-digital (A/D) converter (ADC) system may be used to generate digital codes which represent the level of an analog signal. A direct radio-frequency (RF) sampling receiver may be used to receive and directly digitize a high frequency analog signal. An analog-to-digital converter system for digitizing a signal in a direct radio-frequency sampling receiver may be required to operate at high speed.

SUMMARY

This disclosure relates to a conversion and folding circuit which includes a voltage-to-delay converter block for converting a voltage signal into delay signals, and a folding block for selecting earlier-arriving and later-arriving ones of the delay signals. The voltage-to-delay converter block includes preamplifiers. The folding block includes logic gates coupled to the preamplifiers. If desired, the conversion and folding circuit may be used to generate a delay signal to be input into an analog-to-digital converter.

This disclosure also relates to a system which has preamplifiers for converting a voltage signal into delay signals, and logic gates for receiving the delay signals from the preamplifiers. The logic gates may have, for example, OR gates for selecting earlier-arriving signals from the preamplifiers, an AND gate for selecting a latest-arriving signal from the OR gates, AND gates for selecting later-arriving signals from the preamplifiers, and an OR gate for selecting an earliest-arriving signal from the AND gates. If desired, this disclosure may be implemented with logic gates other than, or in addition to, OR and AND gates. This disclosure may be implemented, if desired, with one or more different types of electronic devices for implementing one or more Boolean functions and is not limited to the use of OR and AND gates.

If desired, odd and even chains may be provided for outputting delay signals to first and second analog-to-digital converters. According to another aspect of this disclosure, first and second chains and a chain selection circuit may be provided for selectively outputting a delay signal from a desired one of the first and second chains. This disclosure may be implemented, if desired, with three or more chains, and the chain selection circuit may be configured to select the chain which provides the smallest output. This disclosure is not limited to the use of just two folding paths.

DETAILED DESCRIPTION

Figure 1:
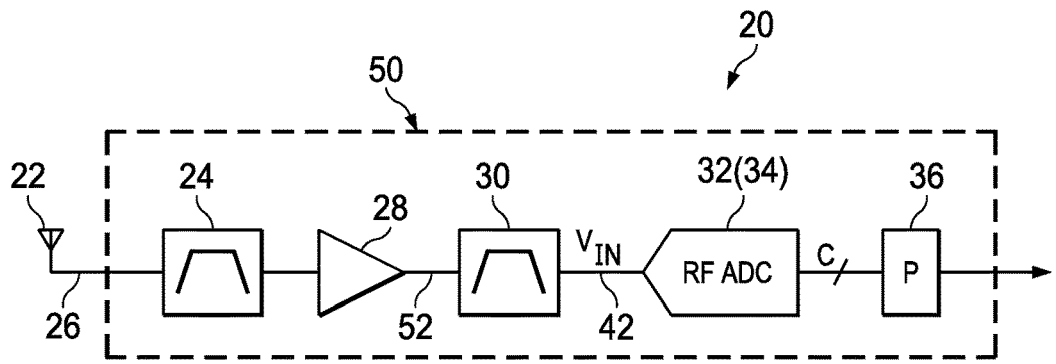
FIG. 1 is a block diagram of an example of a direct radio-frequency sampling receiver.

Referring now to the drawings, where like reference numerals designate like elements, there is shown in FIG. 1 a direct radio-frequency sampling receiver 20 which has an antenna 22, a first bandpass filter 24 for receiving a radio-frequency signal from the antenna 22 (on a conductive line 26), a low-noise amplifier 28, a narrow bandpass filter 30, a first (or a second) radio-frequency analog-to-digital converter system 32 (34) for generating digital codes C, and a signal-processing circuit 36 for processing the digital codes C. The first analog-to-digital converter system 32 is described in more detail below in connection with FIG. 2. The second analog-to-digital converter system 34 is described in more detail below in connection with FIG. 5.

Figure 2:
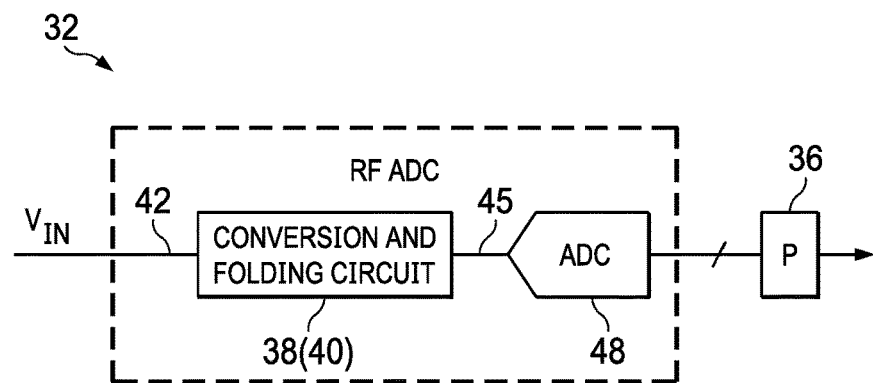
FIG. 2 is a block diagram of a radio-frequency analog-to-digital converter system and a signal-processing circuit for the sampling receiver of FIG. 1.

Referring now to FIG. 2, the first analog-to-digital converter system 32 has a first (or a second) conversion and folding circuit 38 (40) for receiving an input signal having an input voltage $V_{IN}$ on a conductive line 42. The first (or the second) conversion and folding circuit 38 (40) generates a delay signal on a conductive line 45, as described in more detail below. The illustrated analog-to-digital converter system 32 also has an analog-to-digital converter (also referred to herein as a time delay-based backend analog-to-digital converter) 48. The analog-to-digital converter 48 uses the delay signal on line 45 to generate the digital codes C.

According to this disclosure, at least the analog-to-digital converter system 32 (34, FIG. 1) is integrated into an integrated circuit (IC) and/or a chip 50 fabricated according to various semiconductor and/or other processes. One or more conductive lines 42, 45 (FIG. 2) and other devices and elements of the receiver 20 (FIG. 1) may be diffused or implanted into one or more layers of semiconductor material (not illustrated). The integrated devices and elements 32 (34), 42, 45 (FIG. 2) include transistors, resistors, and other suitable electronic devices that are not shown in the drawings for the sake of clarity.

In the illustrated configuration, the first bandpass filter 24 (FIG. 1) is a wideband, low-loss, preselect device, and provides most of the desired out-of-band rejection for the receiver 20. The first bandpass filter 24 prevents signals that are far from the desired passband from saturating the analog frontend of the receiver 20. The low-noise amplifier 28 increases the amplitude of weak signals on a conductive line 52. In the illustrated example, the narrow bandpass filter 30 is a surface acoustic wave (SAW) device, and transmits a radio-frequency signal (that is, the input signal having the input voltage $V_{IN}$) on line 42 to the analog-to-digital converter system 32 (34). This disclosure is not limited, however, to the details and specific features of the examples illustrated in the drawings and described herein.

Figure 3:
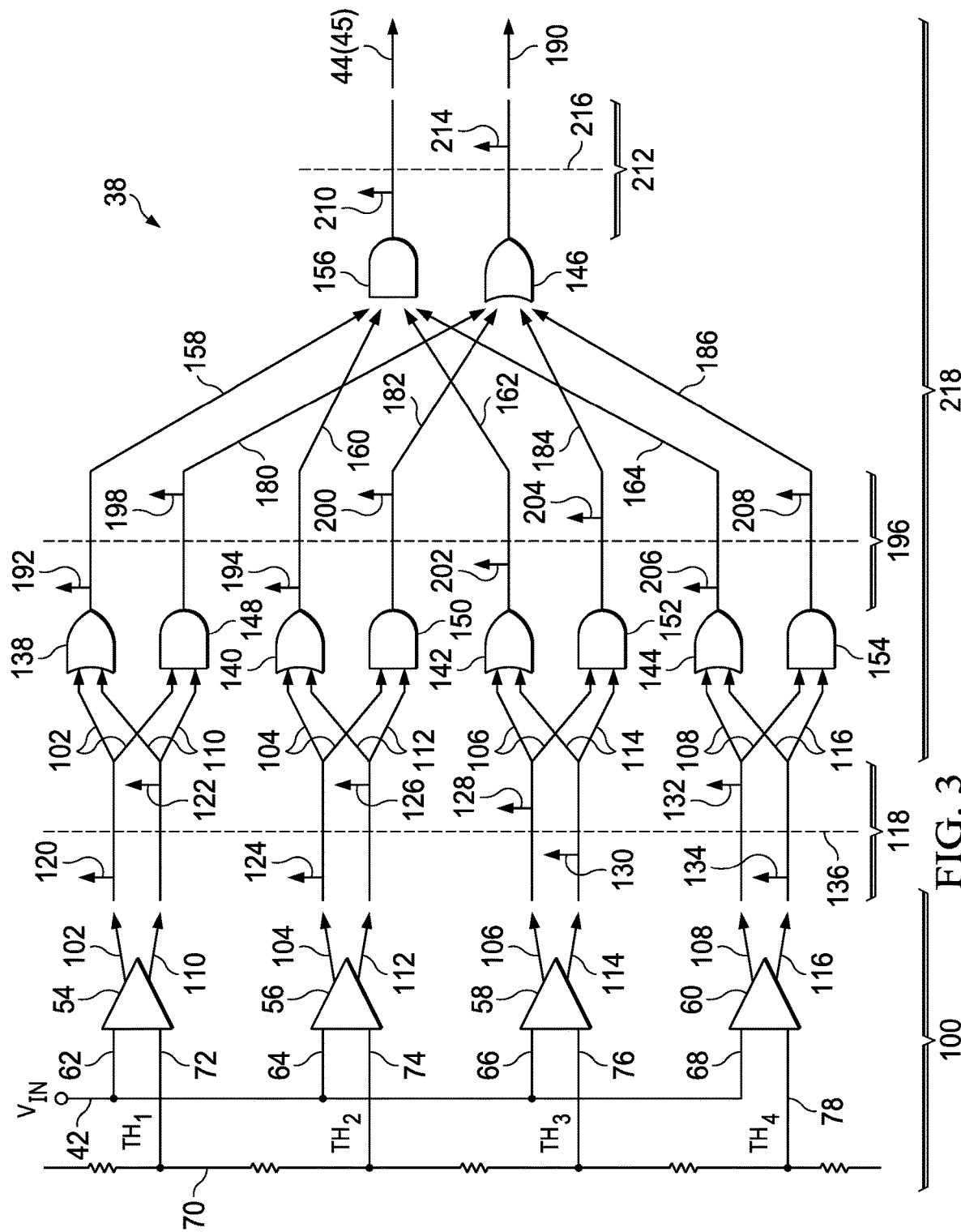
FIG. 3 is a schematic diagram of a conversion and folding circuit for the analog-to-digital converter system of FIG. 2.

Referring now to FIG. 3, the first conversion and folding circuit 38 has first, second, third, and fourth preamplifiers 54, 56, 58, 60. This disclosure is not limited, however, to the illustrated example, and, if desired, may be implemented with a conversion and folding circuit that has more than, or fewer than, four preamplifiers. In the illustrated example, at a suitable timing, the input voltage $V_{IN}$ on line 42 is sampled at first inputs 62, 64, 66, 68 of the preamplifiers 54, 56, 58, 60. First, second, third, and fourth threshold voltages $TH_1$, $TH_2$, $TH_3$, $TH_4$ (where $TH_1<TH_2<TH_3<TH_4$) are generated by a suitable threshold source 70 and applied to respective second inputs 72, 74, 76, 78 of the preamplifiers 54, 56, 58, 60. In the illustrated example, each preamplifier 54, 56, 58, 60 is a low-noise inbuilt threshold integrating preamplifier.

If desired, the input voltage $V_{IN}$ may be, from time to time, less than or equal to the first threshold voltage $TH_1$, between the first and fourth voltages $TH_1$, $TH_4$, or greater than the fourth voltage $TH_4$. In operation, the sampled input voltage $V_{IN}$ is converted into delay within a preamplifier frontend (also referred to herein as a voltage-to-delay converter block) 100 that spans across the desired range of the input voltage $V_{IN}$. The preamplifier frontend 100 includes the preamplifiers 54, 56, 58, 60, which generate first signals (examples of "delay signals") on respective first output lines 102, 104, 106, 108, and second signals (examples of "delay signals") on respective second output lines 110, 112, 114, 116. As described in more detail below, each one of the preamplifiers 54, 56, 58, 60 functions in the illustrated configuration as a voltage-to-delay converter. Thus, in operation, the converter block 100 transforms an incoming electrical signal from a voltage domain to a delay domain. In the illustrated configuration, the analog input $V_{IN}$ (on line 42) is followed by many voltage-to-delay outputs. In the example illustrated in FIG. 3, the voltage-to-delay outputs are on lines 102, 104, 106, 108, 110, 112, 114, 116.

The relative timing of the leading edges of the signals on the first and second output lines 102, 104, 106, 108, 110, 112, 114, 116 is schematically represented in FIG. 3 by the relative positions of upwardly pointing arrows in a first timing chart 118. FIG. 3 schematically illustrates a condition in which the input voltage $V_{IN}$ is less than, but relatively close to, the third threshold voltage $TH_3$, and much greater than the first and second threshold voltages $TH_1$, $TH_2$. Thus, in the illustrated condition, the first and second preamplifiers 54, 56 become saturated, and the leading edges of the signals on the first and second ones of the first output lines 102, 104 are generated at the earliest possible time (represented by arrows 120, 124 being located at the far-left side of the timing chart 118), and the leading edges of the signals on the first and second ones of the second output lines 110, 112 are generated at the latest possible times (represented by arrows 122, 126 being located at the far-right side of the timing chart 118).

When the input voltage $V_{IN}$ is less than, but relatively close to, the third threshold voltage $TH_3$, as schematically illustrated in FIG. 3, the leading edge of the signal on the third one of the second output lines 114 precedes the leading edge of the signal on the third one of the first output lines 106. The sequence is represented by respective arrows 130, 128 being located to the left and right of a middle timing line 136, and the delay is represented schematically by the relative locations of arrows 128, 130. In this example, the delay represented by the positions of arrows 128, 130 (corresponding to the third preamplifier 58) is the information that is desired to be provided to the analog-to-digital converter 48 (FIG. 2).

When the input voltage $V_{IN}$ is much less than the fourth threshold voltage $TH_4$, as schematically illustrated in FIG. 3, then the fourth preamplifier 60 becomes saturated, the leading edge of the signal on the fourth one of the first output lines 108 is generated at the latest possible time (represented by arrow 132 being located at the far-right side of the timing chart 118), and the leading edge of the signal on the fourth one of the second output lines 116 is generated at the earliest possible time (represented by arrow 134 being located at the far-left side of the timing chart 118).

In the FIG. 3 example, the delay information that is schematically represented in the first timing chart 118 as distances to and from the middle timing line 136 indicates that the input voltage $V_{IN}$ is less than, but relatively close to, the third threshold voltage $TH_3$. If the input voltage $V_{IN}$ were to move toward a value that is slightly less than what is represented in FIG. 3, then the locations of arrows 128, 130 (associated with the third preamplifier 58) would move toward each other. If the input voltage $V_{IN}$ were to move even further away from the third threshold voltage $TH_3$, and approach a value midway between the second and third threshold voltages $TH_2$, $TH_3$, then the second preamplifier 56 would no longer become saturated, and the positions of arrows 124, 126 (associated with the second preamplifier 56) would start to move toward each other.

If the output voltage $V_{IN}$ were to be equal to a value midway between the second and third threshold voltages $TH_2$, $TH_3$, then arrows 124, 126, 128, 130 would all be located on the middle timing line 136. In operation, the leading edge of a signal from one of the first output lines precedes the leading edge of a signal from the corresponding one of the second output lines when the input voltage $V_{IN}$ is greater than the threshold voltage of the respective preamplifier. Conversely, the leading edge of the signal from one of the first output lines follows (lags behind) the leading edge of the signal from the corresponding one of the second output lines when the input voltage $V_{IN}$ is less than the threshold voltage of the respective preamplifier.

When the input voltage $V_{IN}$ is between the threshold voltages of adjacent preamplifiers (56, 58 in the FIG. 3 example), but closer to the threshold voltage of one of the adjacent preamplifiers (58 in the FIG. 3 example), then the magnitude of the delay associated with the signals from that one preamplifier (58) corresponds to the value of the input voltage $V_{IN}$ relative to (1) the mid-point voltage halfway between the adjacent threshold voltages ($TH_2$, $TH_3$ in the FIG. 3 example) and (2) the threshold voltage to which the input voltage $V_{IN}$ is closest ($TH_3$ in the FIG. 3 example). If there is no difference in the timing of the two signals, then the input voltage $V_{IN}$ is equal to the mid-point voltage halfway between the adjacent threshold voltages.

The term "adjacent preamplifiers," as used in this disclosure, means two preamplifiers whose threshold voltages are both less than, or greater than, the threshold voltage of any other preamplifier in the voltage-to-delay converter block 100. For example, the first and second preamplifiers 54, 56 illustrated in FIG. 3 are "adjacent preamplifiers" because their threshold voltages $TH_1$, $TH_2$ are both less than the threshold voltage $TH_3$ of the third preamplifier 58, and both less than the threshold voltage $TH_4$ of the fourth preamplifier 60.

Likewise, the second and third preamplifiers 58, 60 are "adjacent preamplifiers" because their threshold voltages TH$_2$, TH$_3$ are both greater than the threshold voltage TH$_1$ of the first preamplifier 54, and both less than the threshold voltage TH$_4$ of the fourth preamplifier 60. The first and third preamplifiers 54, 60, on the other hand, are not "adjacent preamplifiers," because their threshold voltages TH$_1$, TH$_3$ are neither both less than nor both greater than the threshold voltage TH$_2$ of the second preamplifier 56. The existence of the second preamplifier 56 in the voltage-to-delay converter block 100 prevents the first and third preamplifiers 54, 56 from being considered "adjacent preamplifiers."

Figure 4:
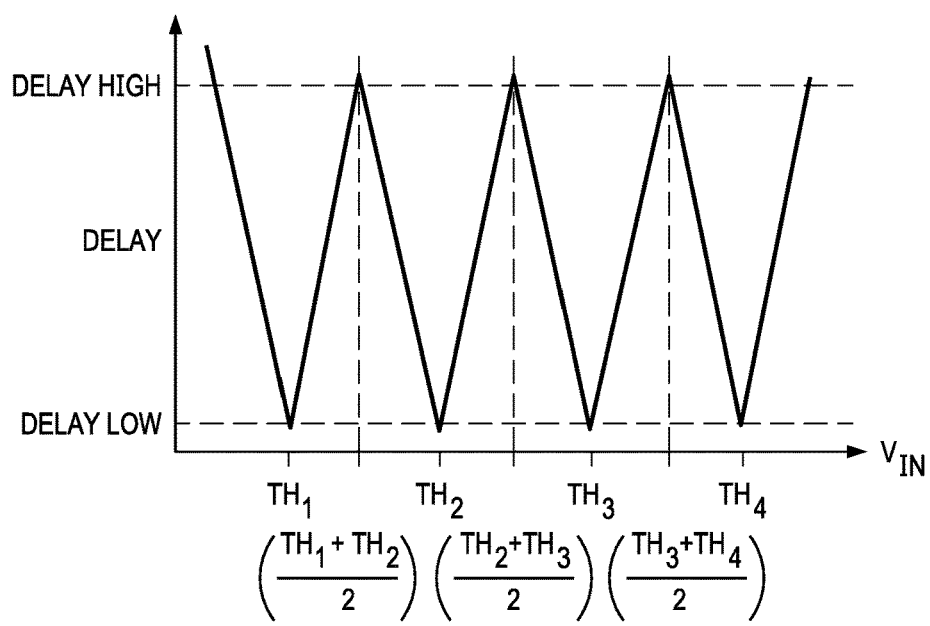
FIG. 4 is a graph of a folding transfer function for the conversion and folding circuit of FIG. 3.

In the illustrated example, the delay information developed by the preamplifiers 54, 56, 58, 60 is folded by first, second, third, fourth, and fifth OR gates 138, 140, 142, 144, 146 and first, second, third, fourth, and fifth AND gates 148, 150, 152, 154, 156, according to the transfer function illustrated in FIG. 4. The first one of the first output lines 102 (FIG. 3) is connected to inputs of the first OR and AND gates 138, 148, and the first one of the second output lines 110 is connected to inputs of the first OR and AND gates 138, 148. In like manner, the first and second output lines 104, 106, 108, 112, 114, 116 of the second, third, and fourth preamplifiers 56, 58, 60 are connected to inputs of the respective second, third, and fourth OR and AND gates 140, 142, 144, 150, 152, 154. Output signals generated by the first through fourth OR gates 138, 140, 142, 144 (on conductive lines 158, 160, 162, 164) are input to the fifth AND gate 156, and output signals generated by the first through fourth AND gates 148, 150, 152, 154 (on conductive lines 180, 182, 184, 186) are input to the fifth OR gate 146. In each case, the timing of the output signals generated by the OR gates 138, 140, 142, 144, 146 corresponds to the timing of the first signal to arrive at the respective inputs of the OR gates 138, 140, 142, 144, 146, whereas the timing of the output signals generated by the AND gates 148, 150, 152, 154, 156 corresponds to the timing of the last signal to arrive at the respective inputs of the AND gates 148, 150, 152, 154, 156.

In operation, the preamplifier frontend 100 generates preamplifier outputs with early and late rising edges. Then, the first through fourth OR gates 138, 140, 142, 144 select the signals which reach them first (earlier), and generate signals on lines 158, 160, 162, 164 with timings which correspond to the selected (earlier-arriving) signals. Meanwhile, the first through fourth AND gates 148, 150, 152, 154 select the signals which reach them last (later), and generate signals on lines 180, 182, 184, 186 with timings which correspond to the selected (later-arriving) signals. The fifth AND gate 156 generates a signal on conductive line 44 which preserves the timing of the latest-arriving of the earlier-arriving signals (corresponding to the position of arrow 130 in the FIG. 3 example), and the fifth OR gate 146 generates a signal on a conductive line 190 which preserves the timing of the earliest-arriving of the later signals (corresponding to the position of arrow 128 in the FIG. 3 example), as delay information that can be encoded by the analog-to-digital converter 48 (FIG. 2).

Referring again to the example illustrated in FIG. 3, the signals output by the first and second OR gates 138, 140 are generated at the earliest possible time (because, in this example, the input voltage V$_{IN}$ is much greater than the first and second threshold voltages TH$_1$, TH$_2$). The timing is schematically represented in FIG. 3 by locating arrows 192, 194 at the left-most side of a second timing chart 196. Meanwhile, the signals output by the first and second AND gates 148, 150 are generated at the latest possible time (represented by locating arrows 198, 200 at the right-most side of the second timing chart 196). The signal from the third OR gate 142 precedes the signal from the third AND gate 152 (arrow 202 is to the left of arrow 204 in the second timing chart 196).

The delay information generated by the third preamplifier 58 is preserved by the third OR and AND gates 142, 152. The preserved information is represented schematically in FIG. 3 by the order and relative locations of arrows 202, 204. Finally, the signals output by the fourth OR and AND gates 144, 154 are generated at the earliest and latest possible times, respectively. The locations of arrows 206, 208 at the left and right-most sides of the second timing chart 196 schematically represent, in the FIG. 3 example, that the input voltage V$_{IN}$ is much less than the threshold voltage TH$_4$ of the fourth preamplifier 60.

In the FIG. 3 example, the delay information generated by just one of the preamplifiers 54, 56, 58, 60 can be useful, and sufficient, for purposes of the analog-to-digital converter 48 (FIG. 2). Therefore, the delay information for the most relevant preamplifier (the third preamplifier 58 in the FIG. 3 example) is preserved in the output signal (on line 44) generated by the fifth AND gate 156. As illustrated in FIG. 3, the relative position of arrow 210 in a third timing chart 212 schematically represents the delay of the signal generated by the fifth AND gate 156, which is the same relative delay as that of the signal output on the third one of the second output lines 114.

So long as additional delays caused by the OR gates 138, 140, 142, 144, 146 are at least substantially the same as additional delays caused by the AND gates 148, 150, 152, 154, 156, the delay information generated by the most relevant one of the preamplifiers 54, 56, 58, 60 can be at least substantially preserved in the signals (on lines 190, 44) output by the fifth OR and AND gates 146, 156.

Moreover, ideally the output signal from the last OR gate 146 (on line 190) may not be needed by the analog-to-digital converter 48 (FIG. 2), because the output of the last AND gate 156 (on line 44, FIG. 3) will ideally always be earlier than the output of the last OR gate 146, and its timing will provide all of the relevant information. That is, ideally, the latest of the earlier of the signals input to the first through fourth OR and AND gates 138, 140, 142, 144, 148, 150, 152, 154 will always be earlier than the earliest of the later of the same input signals, and the timing of the signal generated by the fifth AND gate 156 (on line 44) relative to the middle timing 216 of the third timing chart 212 will always be equal to one-half of the timing of the signal generated by the fifth AND gate 156 relative to the timing of the signal generated by the fifth OR gate 146.

The logic chain illustrated in FIG. 3, which includes the logic gates 138, 140, 142, 144, 146, 148, 150, 152, 154, 156, and their connections to each other and to the preamplifiers 54, 56, 58, 60, operates to select a single relevant pair of signal edges from the preamplifiers 54, 56, 58, 60, and pass at least the earlier rising edge of that pair, with associated delay information preserved, to the analog-to-digital converter 48. In other words, for a given input voltage V$_{IN}$, the logic chain illustrated in FIG. 3 (also referred to herein as a gate-based folding block 218) processes signals in the delay domain so as to select the pulse edges from the most-informative preamplifier and forward the associated delay information to the analog-to-digital converter 48.

In the illustrated example, the logic gates in the folding block 218, which are coupled to the preamplifiers 54, 56, 58, 60, perform the desired folding operation. The folding block 218 does not have to have, or include, any comparator, and it does not need to rely on, or require, any multiplexing operation, which is an advantage, because the use of a comparator and/or a multiplexing operation could potentially create problematic issues relating to comparator meta-stability. The folding block 218 is able to select a desired one or more delay signals on its own without receiving a select signal from outside of the folding block 218, which provides important advantages including permitting operation with substantially reduced occurrence of meta-stability. Many potentially adverse issues are at least substantially avoided by the configuration illustrated in FIG. 3.

The folding block 218 causes the delay on the output line 45 (FIGS. 2 and 3) to be a folded function of the input voltage $V_{IN}$. As illustrated in FIG. 4, when the delay on line 45 is relatively low or at a local minimum (that is, when DELAY DELAYLow), the analog-to-digital converter 48 determines that the input voltage $V_{IN}$ is relatively close to, or equal to, one of the threshold voltages $TH_1$, $TH_2$, $TH_3$, $TH_4$. When the delay on line 45 is relatively high or at a local maximum (that is, when DELAY≈DELAYHIGH), then the analog-to-digital converter 48 determines that $V_{IN}$ is close to, or equal to, a voltage that is midway between two adjacent ones of the threshold voltages $TH_1$, $TH_2$, $TH_3$, $TH_4$.

Figure 5:
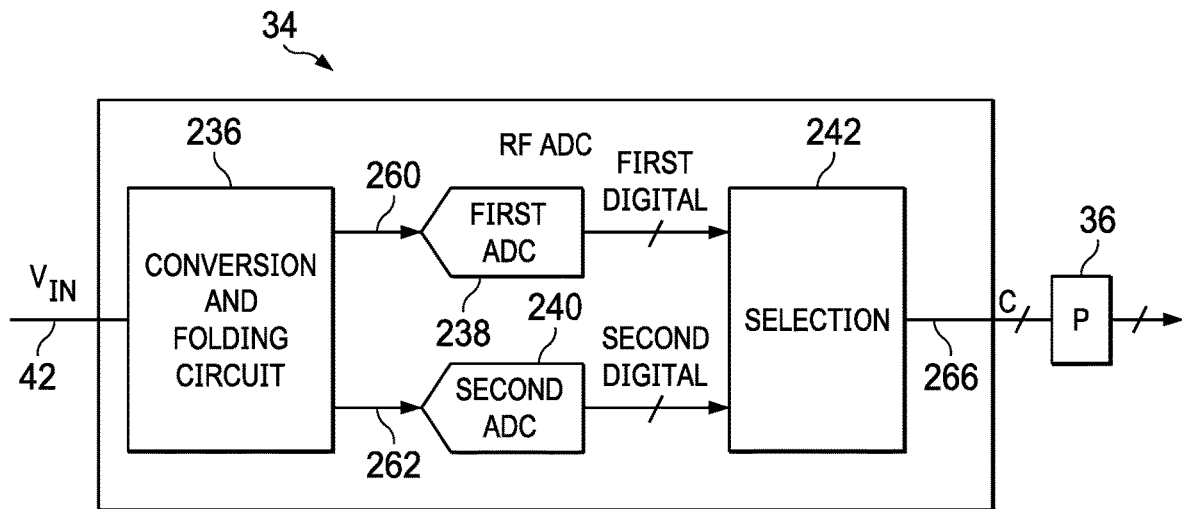
FIG. 5 is a block diagram of another radio-frequency analog-to-digital converter system and a signal-processing circuit for the sampling receiver of FIG. 1.

FIG. 5 shows an analog-to-digital converter system 34 which has a conversion and folding circuit 236, first and second analog-to-digital converters (also referred to herein as time delay-based backend analog-to-digital converters) 238, 240, and a digital selection circuit 242. The conversion and folding circuit 236 receives an input signal having an input voltage $V_{IN}$ on conductive line 42. The conversion and folding circuit 236 generates first and second delay signals on conductive lines 260, 262, based on odd preamplifiers 54, 58 (FIG. 6) and even preamplifiers 56, 60, respectively, as described in more detail below. The selection circuit 242 may be used, if desired, to select digital information ($1^{st}$ Digital or $2^{nd}$ Digital) from one or the other of the analog-to-digital converters 238, 240 as being more representative of the input voltage $V_{IN}$.

Figure 6:
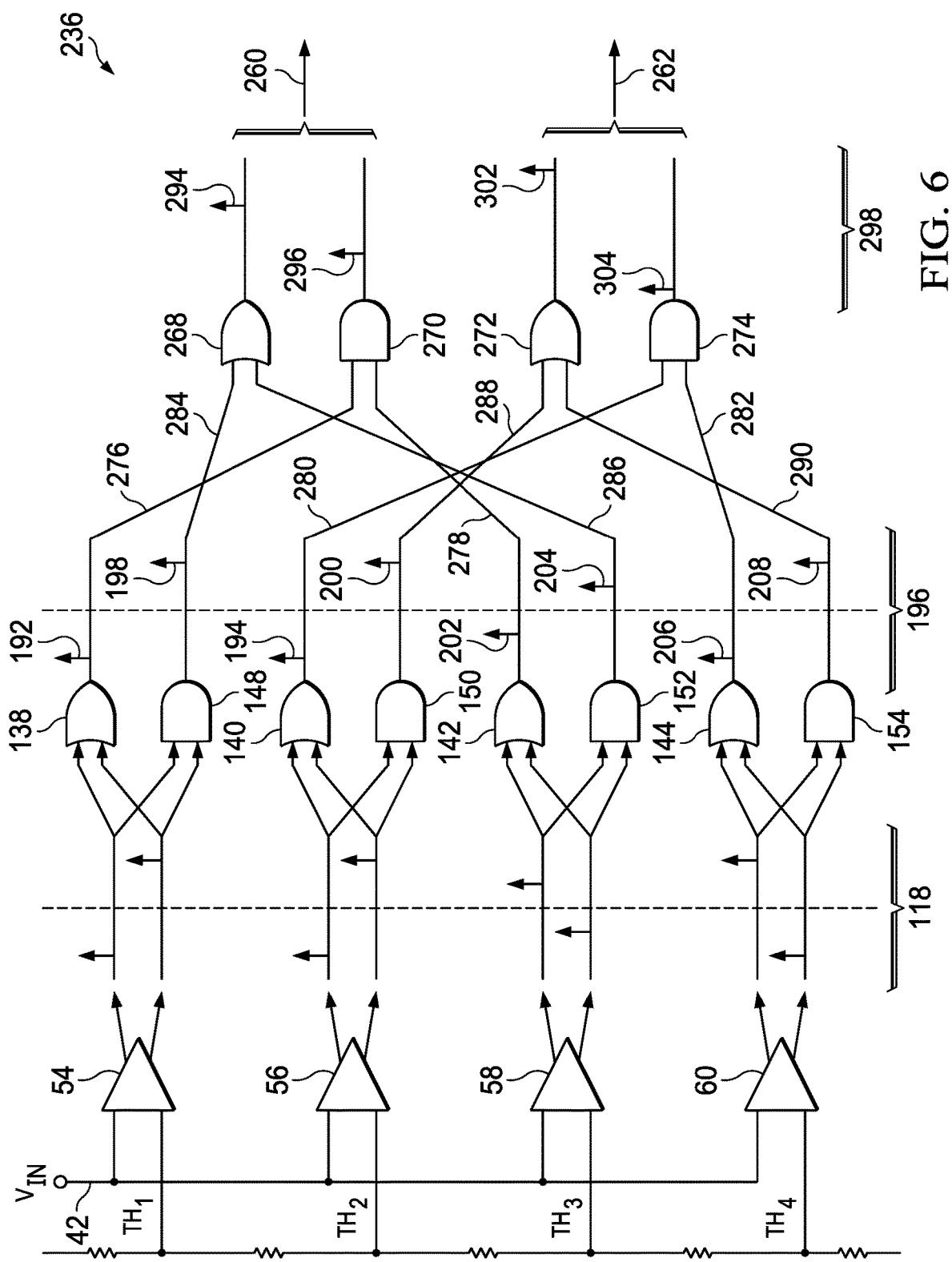
FIG. 6 is a schematic diagram of a conversion and folding circuit for the analog-to-digital converter system of FIG. 5.

The purpose of the conversion and folding circuit 236 is to select two potentially relevant pairs of edges (one of which is the more relevant pair of edges) and pass delay information on the two potentially relevant pairs of edges to the first and second analog-to-digital converters 238, 240. Thus, as illustrated in FIG. 6, the conversion and folding circuit 236 has fifth and sixth OR and AND gates 268, 270, 272, 274. Output lines 276, 278 from the odd OR gates 138, 142 are input into the fifth AND gate 270. Output lines 280, 282 from the even OR gates 140, 144 are input into the sixth AND gate 274. Output lines 284, 286 from the odd AND gates 148, 152 are input into the fifth OR gate 268, and output lines 288, 290 from the even AND gates 150, 154 are input into the sixth OR gate 272.

Figure 7:
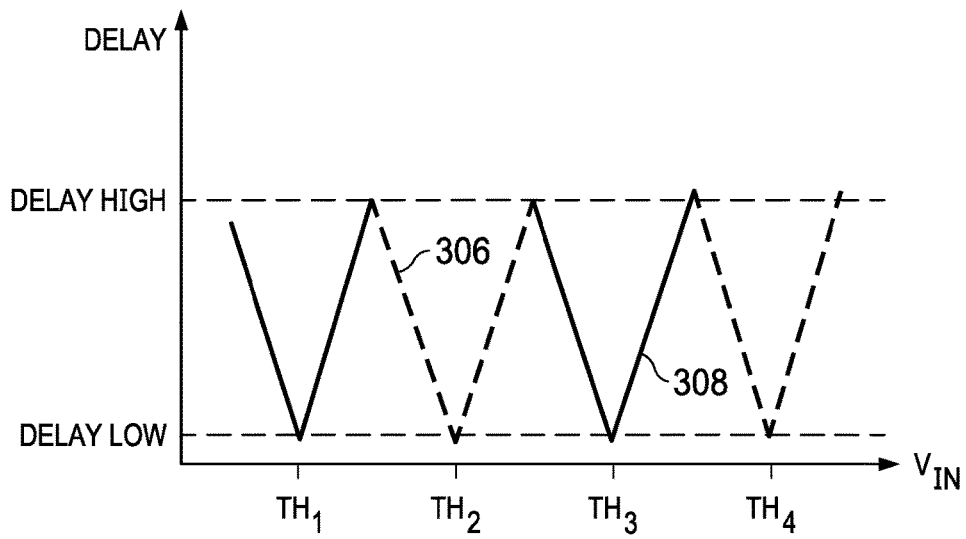
FIG. 7 is a graph of a folding transfer function for the conversion and folding circuit of FIG. 6.

The delay information generated by the odd chain is output by the fifth OR and AND gates 268, 270 on conductive line 260, and is represented schematically in FIG. 6 by the locations of arrows 294, 296 in a fourth timing chart 298. The delay information generated by the even chain is output by the sixth OR and AND gates 272, 274 on a conductive line 262, and is represented schematically by the locations of arrows 302, 304 in the fourth timing chart 298. The transfer function for the conversion and folding circuit 236 is illustrated in FIG. 7, where a portion of the delay information generated by the odd chain (transmitted to the first analog-to-digital converter 238 on line 260) is shown by a solid-line curve 308, and a portion of the delay information generated by the even chain (transmitted to the second analog-to-digital converter 240 on line 262) is shown by a dotted-line curve 306. The digital information output by the selection circuit 242 (FIG. 5) is the lesser of the $1^{st}$ and $2^{nd}$ digital information output by the first and second analog-to-digital converters 238, 240. Thus, the delay information that is ultimately reflected in the digital signal output by the selection circuit 242 corresponds to the lower-value of the two curves 306, 308 shown in FIG. 7 for any given value of the input voltage $V_{IN}$.

Figure 8:
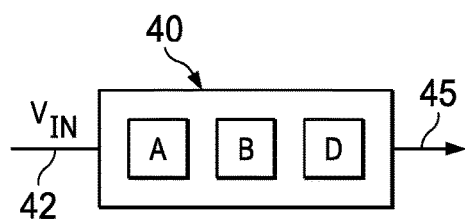
FIG. 8 is a block diagram of another conversion and folding circuit for the analog-to-digital converter system of FIG. 2.
Figure 9:
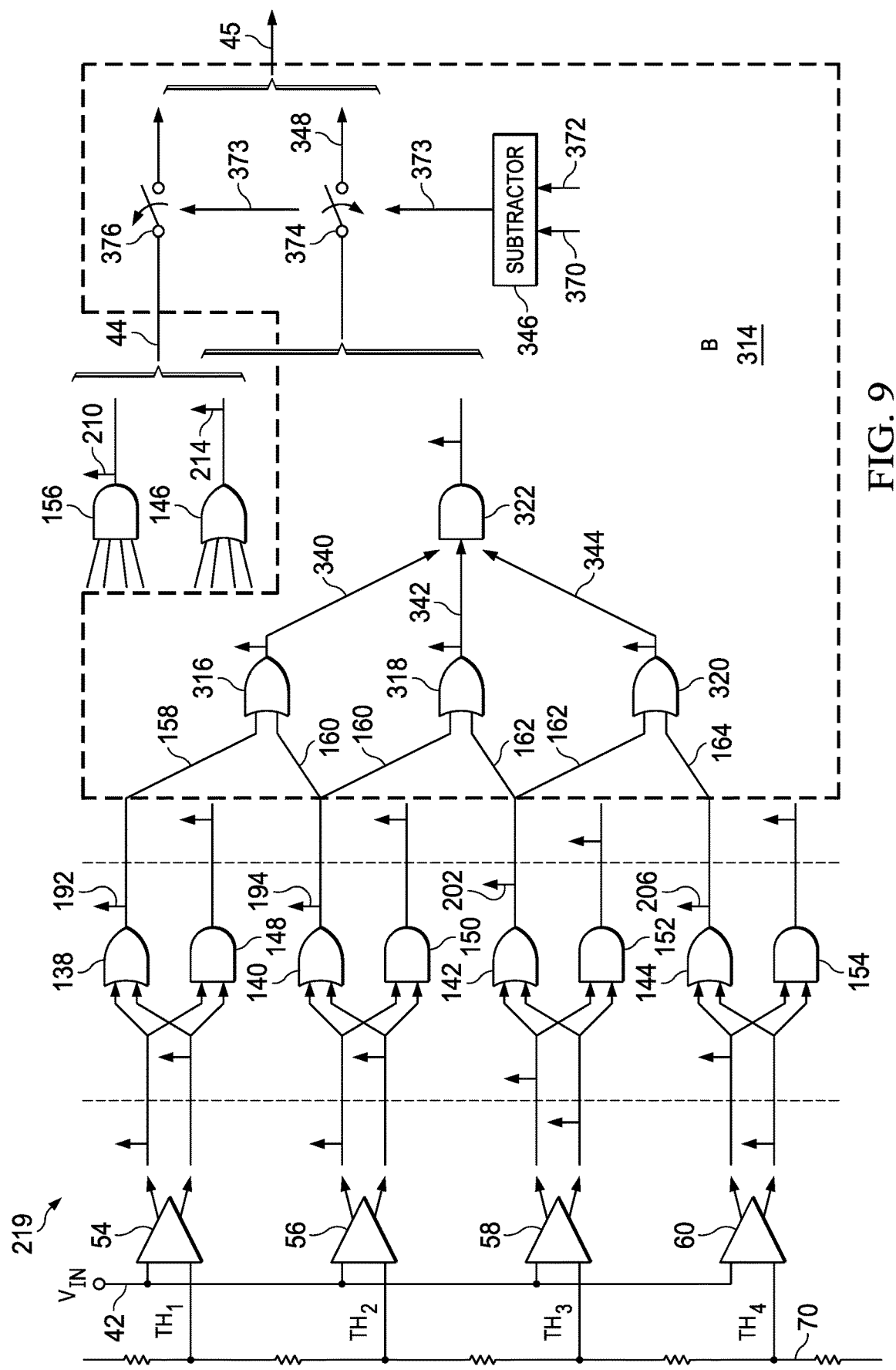
FIG. 9 is a schematic diagram of a portion of the conversion and folding circuit of FIG. 8.
Figure 10:
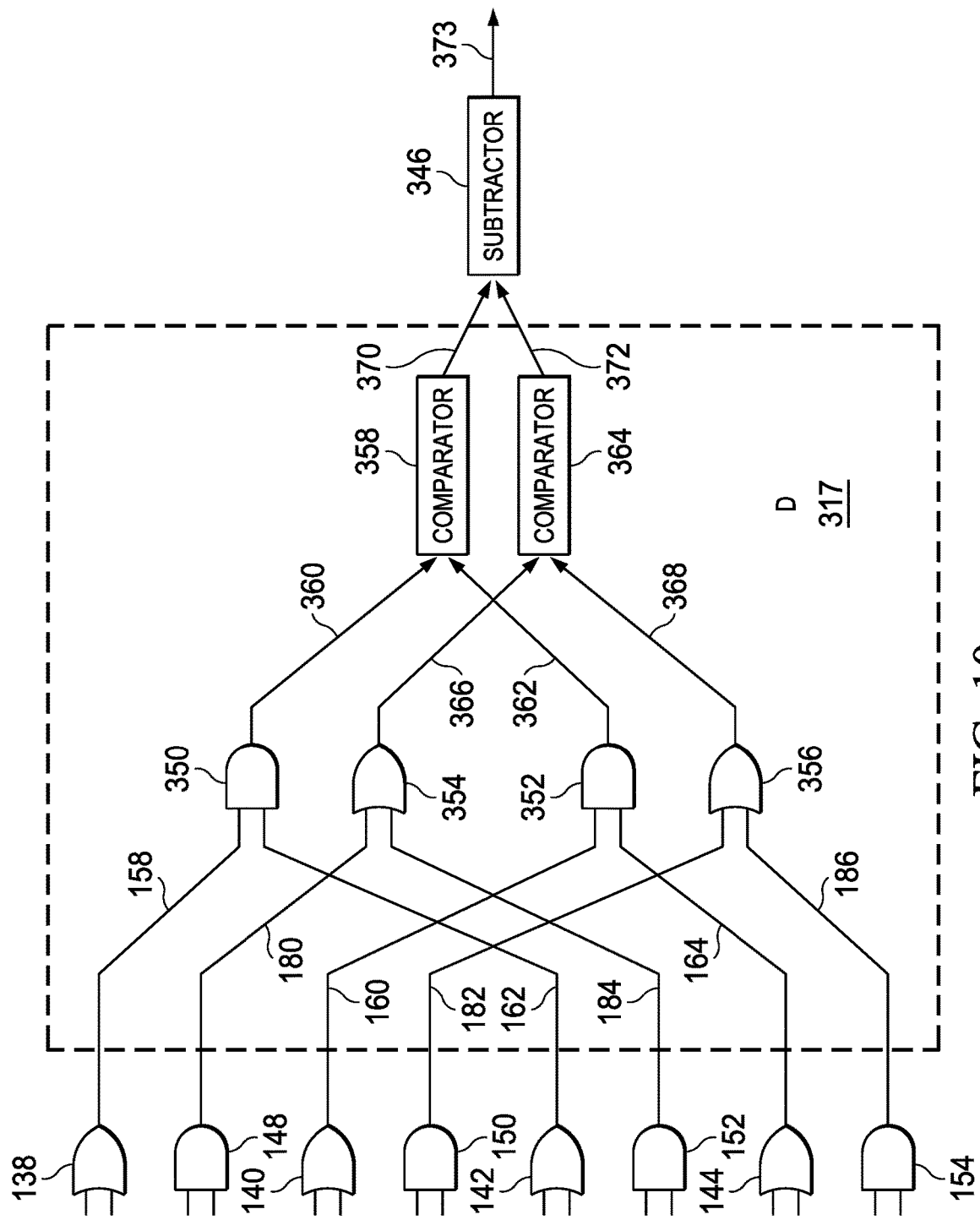
FIG. 10 is a schematic diagram of another portion of the conversion and folding circuit of FIG. 8.

FIGS. 8-10 show, with more detail, the second conversion and folding circuit 40 of FIG. 2. The conversion and folding circuit 40 receives an input signal, on line 42, having an input voltage $V_{IN}$. As illustrated schematically in FIG. 8, and as explained in more detail below, the conversion and folding circuit 40 includes at least elements A, B, and D. Elements A include all of the devices and structures shown in FIG. 3. Elements B include all of the devices and structures shown within block 314 of FIG. 9, and elements D include all of the devices and structures shown within block 317 of FIG. 10.

The conversion and folding circuit 40 has first and second chains 218, 219. The first chain 218 is the folding block 218 that is shown in FIG. 3, ending with the fifth OR and AND gates 146, 156. Parts of the first chain are not illustrated in FIG. 9 for the sake of clarity; however, all of the devices and elements shown in FIG. 3 are part of the conversion and folding circuit 40. The first chain identifies, on lines 44, 190, the latest of the earlier rising edges and the earliest of the later rising edges, respectively, of the signals on the preamplifier-output lines 102, 104, 106, 108, 110, 112, 114, 116.

The second chain 219 (shown in FIG. 9) uses (1) a portion of the first chain ending in the fifth OR gate 146 to identify the earliest of the later rising edges of the preamplifier-output signals and (2) sixth, seventh, and eighth OR gates 316, 318, 320 and a sixth AND gate 322 to identify the latest of the earlier rising edges among earlier rising edges of signals output from adjacent preamplifiers. As illustrated in FIG. 9, the outputs 158, 160 of the first and second OR gates 138, 140 (corresponding to the adjacent first and second preamplifiers 54, 56) are input to the sixth OR gate 316. The outputs 160, 162 of the second and third OR gates 140, 142 are input to the seventh OR gate 318. The outputs 162, 164 of the third and fourth OR gates 142, 144 are input to the eighth OR gate 320. Conductive output lines 340, 342, 344 from the sixth, seventh, and eighth OR gates 316, 318, 320 are coupled to the inputs of the sixth AND gate 322.

This disclosure is not limited to the specific features of the examples shown in the drawings and described herein. For example, this disclosure is not necessarily limited to the first and second chains (two chains) configuration illustrated in FIGS. 8 and 9. This disclosure may be implemented, if desired, with three or more logic-gate chains.

Referring again to FIG. 8, the conversion and folding circuit 40 operates on the assumption that any preamplifier mismatches are relatively small. For any given value of the input voltage $V_{IN}$, all of the earlier edges generated by all of the preamplifiers 54, 56, 58, 60 will likely precede all of the later edges generated by the preamplifiers 54, 56, 58, 60. Thus, the first chain (FIG. 3) can be used to preserve the relevant delay information when the input voltage $V_{IN}$ is near or equal to any one of the preamplifier thresholds $TH_1$, $TH_2$, $TH_3$, $TH_4$. However, the conversion and folding circuit 40 sometimes passes on only delay information generated by the second chain (FIG. 9), that is, from the sixth AND gate 322 and the fifth OR gate 146, under the control of a signal from a delay subtractor 346. A determination is made by chain selection logic as to whether the output on line 44 from the first chain, or the output on line 348 from the second chain, should be sent to the analog-to-digital converter 48

(FIG. 2), and the determination of the chain selection logic is executed by the subtractor 346.

FIG. 10 shows the chain selection logic for operating the subtractor 346. The illustrated logic system includes first and second chain-selection AND gates 350, 352 coupled to odd and even OR gates 138, 142, 140, 144, respectively, and first and second chain-selection OR gates 354, 356 coupled to odd and even AND gates 148, 152, 150, 154, respectively. The outputs of the chain-selection AND gates 350, 352 are applied to a first comparator 358 by first and second conductive lines 360, 362. The outputs of the chain-selection OR gates 354, 356 are applied to a second comparator 364 by conductive lines 366, 368. Outputs 370, 372 from the comparators 358, 364 are applied to the inputs of the subtractor 346.

In operation, the first comparator 358 determines whether the latest of the earlier rising edges is from an even or an odd preamplifier. The second comparator 364 does the same for the earliest of the later rising edges. If the two comparators 358, 364 do not agree (even or odd), then there is a preamplifier mismatch, the comparator outputs 370, 372 are not the same (that is, the comparator outputs 370, 372 do not match), and the subtractor 346 issues a signal on line 373 to close a switch 374 on the output line 348 of the second chain, and to open a switch 376 on the output line 44 of the first chain, such that only the output of the second chain is applied to the analog-to-digital converter 48. If the two comparators 358, 364 do agree (even or odd), then there is no preamplifier mismatch, the comparator outputs 370, 372 are the same, and the subtractor 346 does not issue a signal on line 373 to close the switch 374 for the second chain or to open the switch 376 for the first chain, such that only the output of the first chain is applied (on line 45) to the analog-to-digital converter 48.

Figure 11:
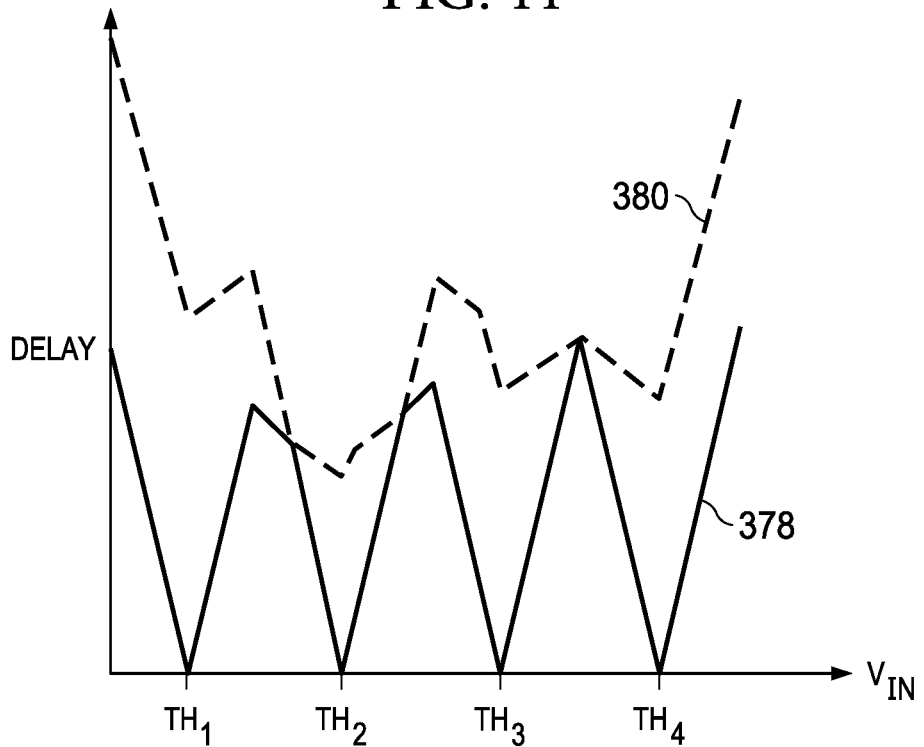
FIG. 11 is a graph of two folding transfer functions representing two preliminary information streams generated by the conversion and folding circuit of FIG. 8.
Figure 12:
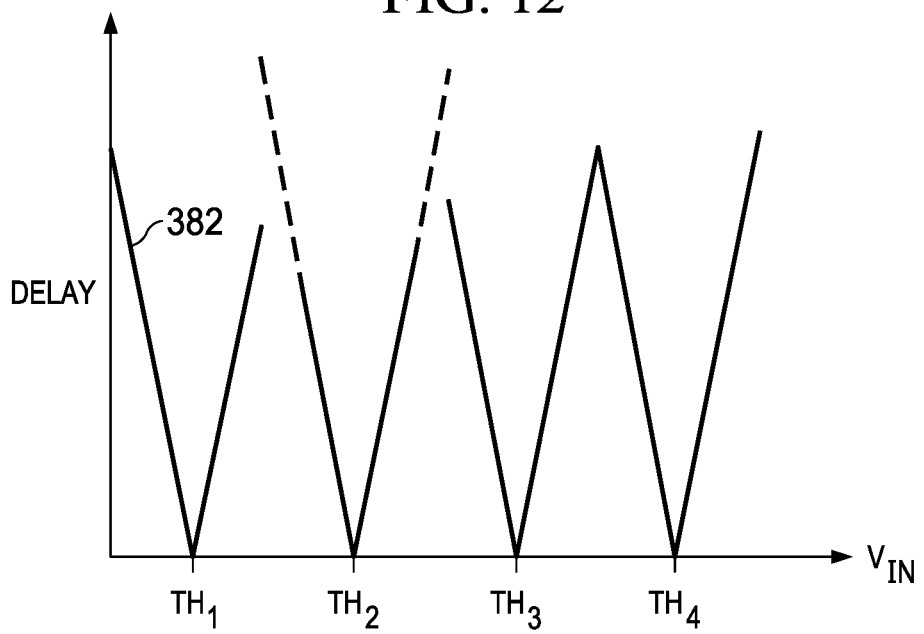
FIG. 12 is a graph of a folding transfer function representing final, selected delay information generated by the conversion and folding circuit of FIG. 8.

First and second gain curves 378, 380 for the first chain (FIG. 3) and the second chain (FIG. 9), respectively, are illustrated in FIG. 11, under a condition where one or more preamplifiers contains some mismatch. The gain curve 382 for the final output (on line 45, FIG. 2) that is applied to the analog-to-digital converter 48 is illustrated in FIG. 12. Gain for the portion of the illustrated function that is supplied by the first chain is reflected in FIG. 12 by solid lines. Gain for the portion of the illustrated function that is supplied by the second chain is reflected in FIG. 12 by broken lines.

This disclosure provides examples of a system which uses preamplifiers to transform a sampled voltage signal into a delay domain for processing. The system uses digital gates for folding the resulting delay signal. The system may be operated, if desired, with low power usage, low noise generation, and/or at high speed. In particular, if desired, the system may have low power requirements for signal storage, and may have relatively few switches and/or other elements that could contribute to folding noise. The delay signal that is ultimately transmitted to a delay-based backend analog-to-digital converter may pass through a folding block along only one path, such that the system may be operated, if desired, with low noise. Moreover, the examples described herein may be operated effectively at least substantially without regard to any device meta-stability. Unlike signal processing in the voltage domain, where a decision cannot be forced without losing sign information, in the delay domain, the delay in the arrival of the signal is the information—the nature of the arriving signal itself has no relevant information. Therefore, according to this disclosure, after a suitable time-out, an output signal may, if desired, be forced.

An important aspect of this disclosure is that one or more signals representative of voltage can be processed in delay domain so that folding can be done using simple gates. According to one aspect of this disclosure, the gates look at early and late edges to choose the correct (or desired) preamplifier output to be propagated to a next stage. The number of folded outputs that are created may be one, two, or more.

According to this disclosure, folding can be achieved by selecting a preamplifier whose delay is minimum (that is, whose delay is the smallest amongst the delays generated by other preamplifiers). The selection can be achieved by selecting the correct (that is, the most relevant) earlier and later edges. Boolean gates (not necessarily OR and AND gates) are used to select the correct edges. This disclosure is not restricted to the use of only OR and AND gates.

Ordinal numbers ("first," "second," "third," etc.) are used herein only to provide clarity and context, and should not be considered limiting except to distinguish similar elements from each other in context. For example, some or all of the first, second, third, and fourth OR gates 138, 140, 142, 144 are sometimes referred to herein collectively as examples of "first" OR gates, to distinguish them from one or more other OR gates in context, and the fifth AND gate 156 is sometimes referred to herein as a "second gate," or as an example of a "first" AND gate, to distinguish it from one or more other AND gates in context. In like manner, some or all of the first, second, third, and fourth AND gates 148, 150, 152, 154 are sometimes referred to herein collectively as examples of "second" AND gates, and the fifth OR gate 146 is sometimes referred to herein as an example of a "second" OR gate, for the sake of context and clarity. Logic elements of the even chain illustrated in FIG. 6 are sometimes referred to herein as examples of "third" elements, to distinguish them from one or more other logic elements in context. Similarly, the sixth, seventh, and eighth OR gates 316, 318, 3120 and the sixth AND gate 322 illustrated in FIG. 9 are sometimes referred to herein as "third" OR and AND gates to distinguish them from one or more other logic elements.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A conversion and folding circuit, comprising:
    a voltage-to-delay converter block, including preamplifiers, for converting a voltage signal into delay signals; and
    a folding block, including logic gates coupled to the preamplifiers, for selecting earlier-arriving and later-arriving ones of the delay signals.

2. The conversion and folding circuit of claim 1, wherein the logic gates include first gates for selecting earlier-arriving signals from the preamplifiers, and a second gate for selecting a latest-arriving signal from the first gates, wherein the first and second gates are coupled to the preamplifiers.

3. The conversion and folding circuit of claim 1, wherein the folding block includes multiple chains of logic gates, and wherein the folding circuit is configured to select a smallest delay signal from one of the chains of logic gates, without receiving a select signal from outside of the folding block.

4. The conversion and folding circuit of claim 2, wherein the folding block includes an odd chain and an even chain, wherein the odd chain includes the first gates and the second gate, wherein the even chain includes third gates for selecting earlier-arriving signals from the preamplifiers, and a fourth gate for selecting a latest-arriving signal from the third gates, wherein the preamplifiers include adjacent preamplifiers, and wherein the odd chain receives delay signals from a first one of the adjacent preamplifiers, and the even chain receives delay signals from a second one of the adjacent preamplifiers.

5. The conversion and folding circuit of claim 2, wherein the folding block includes a first chain and a second chain, wherein the first chain includes the first gates and the second gate, and wherein the second chain includes third gates, coupled to the first gates, for selecting earlier-arriving signals associated with adjacent ones of the preamplifiers, and a fourth gate for selecting a latest-arriving signal from the third gates.

6. The conversion and folding circuit of claim 5, wherein the first chain includes AND gates for selecting later-arriving signals from the preamplifiers, and an OR gate for selecting an earliest-arriving signal from the AND gates, wherein the OR gate is coupled to the AND gates, and wherein the second chain includes the AND gates and the OR gate.

7. The conversion and folding circuit of claim 6, further comprising a chain selection circuit for selecting one of the first and second chains, and wherein the chain selection circuit includes first and second comparators.

8. The conversion and folding circuit of claim 7, wherein the chain selection circuit is coupled to the first and second chains, and causes an output of the second chain to be transmitted to an analog-to-digital converter when outputs of the first and second comparators do not match.

9. A system, comprising:
preamplifiers for converting a voltage signal into delay signals; and
logic gates for receiving the delay signals from the preamplifiers;
wherein the logic gates include first gates for selecting earlier-arriving signals from the preamplifiers, and a second gate for selecting a latest-arriving signal from the first gates, wherein each one of the first gates is coupled to a respective one of the preamplifiers, and wherein the second gate is coupled to the first gates; and
wherein the logic gates further include AND gates for selecting later-arriving signals from the preamplifiers, and an OR gate for selecting an earliest-arriving signal from the AND gates, wherein the OR gate is coupled to the AND gates.

10. The system of claim 9, further comprising an odd chain and an even chain, wherein the odd chain includes the first gates and the second gate, wherein the even chain includes third gates for selecting earlier-arriving signals from the preamplifiers, and a fourth gate for selecting a latest-arriving signal from the third gates, wherein the preamplifiers include adjacent preamplifiers, and wherein the odd chain receives delay signals from a first one of the adjacent preamplifiers, and the even chain receives delay signals from a second one of the adjacent preamplifiers.

11. The system of claim 9, wherein the logic gates include a first chain and a second chain, wherein the first chain includes the first gates, the second gate, the AND gates, and the OR gate, and wherein the second chain includes the AND gates, the OR gate, third gates, coupled to the first gates, for selecting earlier-arriving signals from adjacent ones of the first gates, and a fourth gate for selecting a latest-arriving signal from the third gates.

12. The system of claim 11, further comprising a chain selection circuit for selectively transmitting an output of one of the first and second chains to an analog-to-digital converter.

13. A conversion and folding circuit for an analog-to-digital converter system, the conversion and folding circuit comprising:
a voltage-to-delay converter block, including preamplifiers, for converting a voltage signal into delay signals, wherein each one of the preamplifiers includes a first input for receiving the voltage signal, and first and second output lines for transmitting the delay signals, and wherein the delay signals are representative of differences between the voltage signal and threshold voltages; and
logic gates coupled to the preamplifiers for folding the delay signals based on timing of the delay signals, and for transmitting an output signal to an analog-to-digital converter, wherein the logic gates include first gates for selecting earlier-arriving delay signals from the preamplifiers, and a second gate for selecting a latest-arriving signal from the first gates, and wherein each one of the first gates is coupled to a respective one of the first output lines and a respective one of the second output lines.

14. The circuit of claim 13, wherein the logic gates include first OR gates for selecting earlier-arriving delay signals from the preamplifiers, and a first AND gate for selecting a latest-arriving signal from the first OR gates, and wherein each one of the first OR gates is coupled to a respective one of the first output lines and a respective one of the second output lines, and wherein the logic gates include second AND gates for selecting later-arriving delay signals, each one of the second AND gates being coupled to first and second output lines of a respective one of the preamplifiers, and a second OR gate for selecting an earliest-arriving signal from the second AND gates, and wherein the second OR gate is coupled to the second AND gates.

15. The circuit of claim 14, wherein the folding block includes an odd chain and an even chain, wherein the odd chain includes the first OR gates and the first AND gate, wherein the even chain includes third OR gates for selecting earlier-arriving signals, and a third AND gate for selecting a latest-arriving signal from the third OR gates, wherein the preamplifiers include adjacent preamplifiers, and wherein the odd chain receives delay signals from a first one of the adjacent preamplifiers, and the even chain receives delay signals from a second one of the adjacent preamplifiers.

16. The circuit of claim 14, wherein the folding block includes a first chain and a second chain, wherein the first chain includes the first OR gates and the first AND gate, and wherein the second chain includes third OR gates, coupled to the first OR gates, for selecting earlier-arriving signals from adjacent ones of the first OR gates, and a third AND gate for selecting a latest-arriving signal from the third OR gates.

17. The circuit of claim 16, wherein the folding block includes a chain selection circuit for outputting a signal from the first chain to an analog-to-digital converter under a first condition, and for outputting a signal from the second chain to the analog-to-digital converter under a second condition, and wherein a difference between the input voltage and one of the threshold voltages is less under the first condition than under the second condition.

18. The circuit of claim 17, wherein the chain selection circuit includes fourth OR gates, fourth AND gates, a first comparator coupled to the fourth AND gates, and a second comparator coupled to the fourth OR gates, wherein the preamplifiers include adjacent preamplifiers, wherein one of the fourth AND gates receives a signal from a first one of the first OR gates, and another one of the fourth AND gates receives a signal from a second one of the first OR gates, and wherein the first and second ones of the first OR gates are coupled to the adjacent preamplifiers.

19. The circuit of claim 18, further comprising an output switch, and wherein the chain selection circuit includes a delay subtractor, coupled to the first and second comparators, for operating the output switch in response to outputs from the first and second comparators.

\* \* \* \* \*